US007691177B2

(12) United States Patent
Crawley et al.

(10) Patent No.: US 7,691,177 B2
(45) Date of Patent: Apr. 6, 2010

(54) METHOD AND AN APPARATUS OF PLASMA PROCESSING OF TANTALUM PARTICLES

(75) Inventors: John Crawley, Mound House, NV (US);
Vladimir Semenovitch Cherednichenko, Novosibirsk (RU);
James Allen Fife, Carson City, NV (US)

(73) Assignee: Niotan, Inc., Mound House, NV (US)

( * ) Notice: Subject to any disclaimer, the term of this patent is extended or adjusted under 35 U.S.C. 154(b) by 220 days.

(21) Appl. No.: 11/929,618

(22) Filed: Oct. 30, 2007

(65) Prior Publication Data

US 2008/0118391 A1      May 22, 2008

Related U.S. Application Data

(60) Provisional application No. 60/855,516, filed on Oct. 30, 2006.

(51) Int. Cl.
*B22F 9/14* (2006.01)
(52) U.S. Cl. ............................................ 75/346; 75/336
(58) Field of Classification Search .................... 75/346
See application file for complete search history.

(56) References Cited

U.S. PATENT DOCUMENTS

| 5,082,491 | A |   | 1/1992 | Rerat |
| 5,259,861 | A |   | 11/1993 | Yeh et al. |
| 6,589,311 | B1 | * | 7/2003 | Han et al. ...................... 75/245 |
| 7,022,155 | B2 | * | 4/2006 | Deegan et al. ................. 75/336 |

FOREIGN PATENT DOCUMENTS

JP        58197206 A  * 11/1983
JP        02050901 A  *  2/1990

* cited by examiner

*Primary Examiner*—George Wyszomierski
(74) *Attorney, Agent, or Firm*—Crowell & Moring LLP

(57) ABSTRACT

Porous microparticles of high-purity tantalum may be processed in a vacuum plasmatron using a hollow cathode and spraying apparatus in which the coolant is in the form of a metal surface. In one embodiment, the initial powder of tantalum is introduced through a coaxial hole in a hollow cathode and supplied to a vertical column of plasma by inert gas and exposed to heating to temperatures close to the melting point of tantalum. The atomizing tantalum particles are directed through a hole in the anode and collide with a rotating inclined tantalum substrate and cooled from within water, thereby flattened and solidifying the particles.

8 Claims, 1 Drawing Sheet

METHOD AND AN APPARATUS OF PLASMA PROCESSING OF TANTALUM PARTICLES

CROSS-REFERENCE TO RELATED APPLICATION

The application claims the benefit of U.S. Provisional Application No. 60/855,516, filed Oct. 30, 2006.

FIELD OF THE INVENTION

The present disclosure relates generally the processing of metal powder and, more particularly, to plasma arc heating of porous particles of high-purity tantalum flakes.

BACKGROUND OF THE INVENTION

With evolution and a microminiaturization of microprocessor engineering and electronics, the need for high-capacitance tantalum capacitors has rapidly increased. Qualifying demands on tantalum powder for use in electrolytic capacitors on purity and developed surface of powder particles are very high and can not always be achieved by known means of powder metallurgy.

There are well-known methods of processing high purity metal powders using vacuum-arc, plasma and electron beam heating of initial metals. Similarly, the known subsequent centrifugal atomization of a melt and cooling to form grain-like or flake-like metal particles have many merits, such as refining the microstructure, giving homogeneous distribution of many parameters, and forming an amorphous phase. However, these methods are inconvenient in view of the high melting point of tantalum. In particular, the collision of the melted particles with a cooled metal surface (usually the copper) results in contaminating the refractory drops with the constituents of the impacted metal surface.

One conventional production method of a tantalum powder for anodes of electrolytic capacitors includes mechanical milling tantalum ingots. The resulting powder has the porous structure similar to agglomerated powder and fits the requirements of developed surface, but does not meet the requirements of surface contamination, which substantially impairs parameters of capacitors. Thus, what is needed is an improved method and apparatus for plasma processing of tantalum particles.

SUMMARY OF THE INVENTION

Disclosed and claimed herein is a method and apparatus for processing tantalum powder particles. In one embodiment, the method includes feeding tantalum powder particles and an inert gas into a hollow cathode of a vacuum chamber, and generating a plasma arc between the hollow cathode and an anode that is oriented below the hollow cathode. The method also includes heating the tantalum powder particles to a predetermined temperature within the plasma arc, and accelerating the tantalum powder particles towards an orifice of the anode using an electric field between the hollow cathode and the anode. Finally, the method includes impacting a cooling surface with the tantalum powder particles, where the cooling surface is located on a side of the anode opposite to the hollow cathode.

Other aspects, features, and techniques of the invention will be apparent to one skilled in the relevant art in view of the following detailed description of the invention.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENT

Overview

Figure 1:
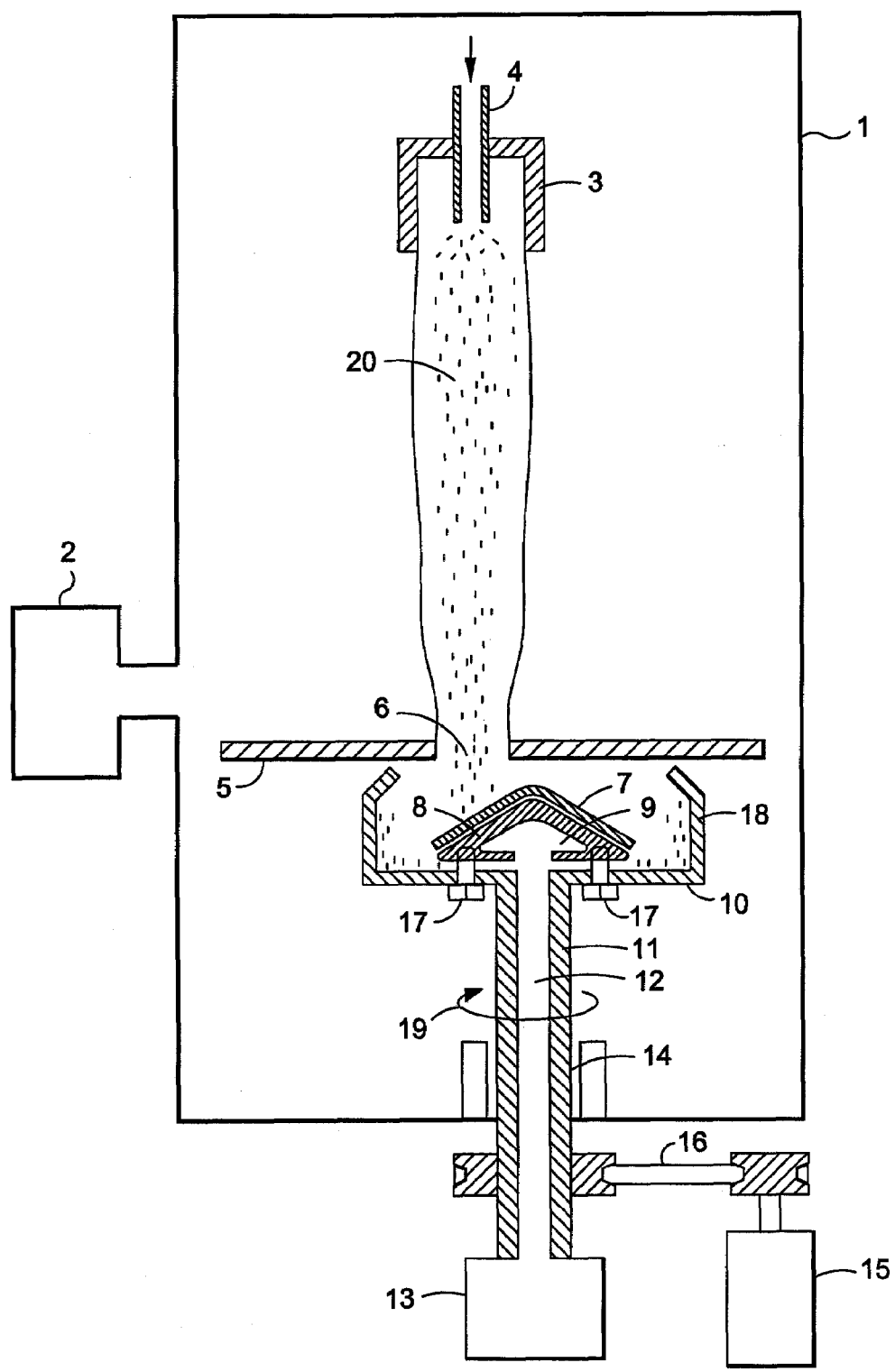
FIG. 1 is a block diagram of a system configured in accordance with one embodiment of the invention.

One aspect of the present disclosure relates to the heating of an initial tantalum powder up to transition temperature into plastic state. Another aspect relates to a method of purification and activation of a surface of an initial powder by an electric field. Still another aspect relates to a method of rapidly cooling of powder particles having a high melting point by a metal surface. In addition, a method of producing flake-like particles of tantalum powder is described, while maintaining a porous structure of the particles.

An apparatus for plasma treatment and activation of an initial tantalum powder, and for making powder particles into flake-like shapes is further described herein. A plasma arc refers to an electric arc that is struck between two electrodes (i.e., a cathode and an anode). The high-energy arc creates a high temperature, highly ionized gas.

Certain aspects of the invention may be practiced using a combination of plasma heating, thermoemission clearing, a hydrodynamic (fluid) and electric atomization in a vertical column of an plasma arc discharge vacuum plasmatron with hollow cathode and an initial tantalum powder cooling by a metal surface. To that end, in one embodiment of the invention includes a vacuum chamber, arc vacuum plasmotron with a hollow cathode for heating and atomization of powder particles, a feeding system for tantalum powder and a rotating metal substrate for cooling of powder particles. In one embodiment, the rotating metal surface may be configured as a hollow copper cone with an angle of the base of approximately 30 degrees and a diameter of 120 mm with the welded on explosion cladding and finished tantalum sheet on a side face. The cone may be rotated at various speeds (e.g., 1400 rev/min), and have a vacuum-tight system of water cooling.

As will be described in more detail below, powder particles exposed to an argon plasma arc with temperatures up to 10000 K will rapidly heat up to a thermoemission temperature and develop a negative charge which defines their acceleration by an electric field between a cathode and anode and their steady containment by electric forces in the center of a plasma column. Surface purification of powder particles may be carried out due to thermoemission and an ionic diffusion of more low-melting impurity. In one embodiment, the terminal velocity within limits of 20-100 m/s and temperature of particles of tantalum powder lower than a melting point, but higher than transition temperature in plastic state are controlled by electric power input, a gas rate and the height of a column of an arc discharge within limits of 100-400 mm.

Accelerated particles of a powder through a hole in the anode at an angle arriving at a cooling metal surface, are spread and rapidly cooled. The solidified flake particles may then be departed from the rotating metal surface by a centrifugal force and collected in a coaxially located chamber. In one embodiment, the chamber may be rotating at the same time as with the cooling cone. Unloading of the processed powder may be carried out cyclically after a by turns aperture stop and a depressurization.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment" or similar term means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner on one or more embodiments without limitation.

Referring now to the figures, one embodiment of a system for implementing the invention is schematically represented in FIG. 1. In particular, a plasmatron for atomization of the tantalum powder is shown in the form of a vacuum chamber 1, which may include the vacuum armature, fore and diffusion pumps, and control circuitry for keeping the vacuum 2 at a level pressure (e.g., 10 Pa).

DESCRIPTION OF EXEMPLARY EMBODIMENTS

In one embodiment, the top portion of the vacuum chamber 1 includes a hollow cathode 3 comprising a zirconium cylinder 4 having a height of approximately 40 mm and a bottom internal diameter of approximately 20 mm. It should of course be appreciated that other dimensions and configurations would be consistent with the principles of the invention.

The zirconium cylinder 4 provides for dual supply of argon gas and tantalum powder, which may be supplied through an opening hole in the bottom of the cathode 3. The cathode 3 may move vertically along the anode 5, which in one embodiment may be about 100 to 400 mm in length. The particles of tantalum powder may be accelerated through a hole 6 (e.g., 50 mm in diameter) in the anode 5 to contact the cooling metal surface 7. In one embodiment, this configuration of a vacuum plasmotron with a hollow cathode may have the advantage of providing a high endurance hollow cathode of more than 1000 operating hours, and provide a high purity plasma beam in the protective atmosphere of argon. Similarly, a wide range of power control and heights of the plasma discharge may be used to allow achieve the necessary temperature for activating a surface and to accelerate up to the required rates for processed particles of tantalum powder of different sizes.

In certain embodiments, the cooling metal surface 7 may be the polished cone having a tantalum sheet thickness of approximately 0.5 mm with an angle of the basis of 30 grades and a diameter of 140 mm, welded on explosion cladding on the copper cone base 8 with one or more internal channels 9 for water cooling. For preventing of ingress of moisture in the working chamber, the cone unit 7 & 8 may have a vacuum seal with a flange 10 by means of screws 17. The flange 10 may be welded onto a shaft 11, having one or more internal channels 12 for output and back cooling water flow. While only a single channel 12 and 9 may be depicted in FIG. 1, it should equally be appreciated that two or more separate channels may be preferred to, for example, provide for separate ingress and egress of cooling water.

Continuing to refer to FIG. 1, a feed unit 13 may be used to provide the required discharge of cooling water. In one embodiment, the shaft 11 may include a vacuum seal 14 and be coaxially rotatable in direction 19 by the electric motor 15 via a tape transmitter 16 at a given speed (e.g., 1400 rev/min).

In certain embodiment, the powder particles 20 together with plasma-forming gas may be rapidly heated up to a thermoemission temperature, while obtaining a negative charge thereby being accelerated by an electric field between the cathode 3 and the anode 5. During the flight path of the particles 20 from the cathode 3 to the cooling surface 7, there may be evaporation of relatively low-melting impurities and thermoemission activation of the surface of the tantalum particles 20. In addition, the aforementioned electric field may keep the powder particles 20 in a column of an arc discharge thereby minimizing dispersion and losses of powder outside of the cooling target (e.g., surface 7) located under the anode 5.

When the powder particles 20 collide with the cooling surface 7 within a given range of at speeds (e.g., about 20-100 m/s) and their temperature is higher than a threshold of plasticity, such particles 20 will tend to spread to form flake-like or strip-like metal particles and cool virtually instantly.

In one embodiment, this process also preserves the porous internal structure of the particles 20, which comprise essentially flat flakes. In one embodiment, such flakes may have a porosity of between 10% and 70%. Such flakes may also exhibit a size of agglomerate of between 10 microns and 100 microns and/or a pore size of between 0.2 microns and 10 microns.

In certain embodiments, the cooling surface 7 may be made of tantalum thereby protecting the powder from impurities. Solidified flakes of tantalum powder may then be departed from the rotating metal substrate by a centrifugal force and collected into a collector 18 which may also be rotating coaxially in the same direction 19 as the cooling surface 7 such that the particles 20 are directed into the collector 18 by the resulting centrifugal force.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Trademarks and copyrights referred to herein are the property of their respective owners.

What is claimed is:

1. A method for processing tantalum powder particles comprising:
    feeding tantalum powder particles and an inert gas into a hollow cathode of a vacuum chamber;
    generating a plasma arc between the hollow cathode and an anode oriented below the hollow cathode;
    heating said tantalum powder particles to a predetermined temperature within said plasma arc;

accelerating said tantalum powder particles towards an orifice of the anode using an electric field between the hollow cathode and the anode; and impacting a cooling surface with said tantalum powder particles, wherein the cooling surface is located on a side of the anode opposite to the hollow cathode.

2. The method of claim 1, wherein said inert gas comprises argon gas, and wherein feeding comprises feeding said tantalum powder particles and argon gas into a zirconium cylinder oriented within an opening of said hollow cathode.

3. The method of claim 1, wherein said predetermined temperature corresponds to a thermoemission temperature of said tantalum powder particles.

4. The method of claim 1, wherein impacting the cooling surface comprises impacting a water-cooled surface having one of an ellipse shape and a cone shape.

5. The method of claim 1, wherein said impacting comprises impacting the cooling surface such that tantalum powder particles deform to a flake-like shape.

6. The method of claim 1, further comprising rotating said cooling surface so as to generate a centrifugal force that directs said that tantalum powder particles to a collector.

7. The method of claim 1, further comprising directing said tantalum powder particles to a position in the plasma arc and maintaining said position using the electric field for a period of time that is a function of one or more of an efficiency of thermoemission, ionic purification, and activation of a surface of the tantalum powder particles.

8. The method of claim 1, wherein said cooling surface comprises a top layer of tantalum.

* * * * *